United States Patent [19]
Adams

[11] Patent Number: 5,879,461
[45] Date of Patent: Mar. 9, 1999

[54] METERED GAS CONTROL IN A SUBSTRATE PROCESSING APPARATUS

[75] Inventor: Douglas R. Adams, Pepperell, Mass.

[73] Assignee: Brooks Automation, Inc., Chelmsford, Mass.

[21] Appl. No.: 49,315

[22] Filed: Mar. 27, 1998

Related U.S. Application Data

[60] Provisional application No. 60/044,494 Apr. 21, 1997.

[51] Int. Cl.[6] .......................... C23C 16/00; C23C 14/00; F28F 7/00; F25D 25/00

[52] U.S. Cl. .................... 118/724; 118/715; 118/719; 204/298.07; 204/298.25; 204/298.35; 62/62; 137/12; 427/398.4; 165/48.1; 165/61; 165/80.1; 165/80.2; 165/185

[58] Field of Search ........................... 118/715, 719, 118/724, 692; 204/298.07, 298.25, 298.26, 298.35; 62/62, DIG. 7; 137/12; 427/398.4; 73/861, 37, 37.5, 49.5, 195; 165/48.1, 61, 80.1, 185, 80.2

[56] References Cited

U.S. PATENT DOCUMENTS

| | | | |
|---|---|---|---|
| 4,963,713 | 10/1990 | Horiuchi et al. | 219/121.43 |
| 5,090,900 | 2/1992 | Rudolf et al. | 432/239 |
| 5,186,718 | 2/1993 | Tepman et al. | 29/25.01 |
| 5,314,574 | 5/1994 | Takahashi | 156/646 |
| 5,399,387 | 3/1995 | Law et al. | 427/574 |
| 5,609,689 | 3/1997 | Kato et al. | 118/719 |
| 5,711,813 | 1/1998 | Kadoiwa et al. | 118/723 VE |
| 5,735,339 | 4/1998 | Davenport et al. | 165/80.1 |
| 5,738,165 | 4/1998 | Imai | 165/80.2 |

FOREIGN PATENT DOCUMENTS

WO 94/23911  10/1994  WIPO .

*Primary Examiner*—R. Bruce Breneman
*Assistant Examiner*—Jeffrie R Lund
*Attorney, Agent, or Firm*—Perman & Green, LLP

[57] ABSTRACT

A method of introducing gas into a substrate processing chamber. The method of introducing gas into a substrate processing chamber comprises the steps of filling a gas metering area with the gas to a first predetermined pressure, closing the area to maintain the area at the first predetermined pressure and opening the area to the substrate processing chamber. When the area is opened to the substrate processing chamber, the gas inside the area will expand into the chamber to provide the chamber with a second predetermined pressure.

20 Claims, 8 Drawing Sheets

| | | Initial Conditions | Unload Step 1 | Unload Step 2 | Unload & Load Step 3 | Load Step 4 | Cool Step 1 | Cool Step 2 | Ready |
|---|---|---|---|---|---|---|---|---|---|
| Digital Outputs | Backfill Valve Open | | | | | | | | |
| | Charge Valve Open | | | | | | | | |
| | Rough Valve Open | | | | | | | | |
| | Poppet Raise | | | | | | | | |
| | Poppet Lower | | | | | | | | |
| Digital Inputs | Poppet Up | | | | | | | | |
| | Poppet Down | | | | | | | | |
| | Argon Chg. Ready (Press. Hi) | | | | | | | | |
| | Poppet Roughed (Press. Low) | | | | | | | | |
| | Chuck High Temp Warning | | | | | | | | |

FIG. 7

METERED GAS CONTROL IN A SUBSTRATE PROCESSING APPARATUS

CROSS-REFERENCE TO RELATED APPLICATION

This application claims the benefit of U.S. Provisional Application Ser. No. 60/044,494, filed Apr. 21, 1997.

BACKGROUND OF THE INVENTION

1. Field of the Invention

The present invention relates to a substrate processing apparatus and, more particularly, to a gas assist processing device.

2. Prior Art

U.S. Pat. No. 4,963,713 discloses cooling of a plasma electrode system for an etching apparatus. U.S. Pat. No. 5,090,900 discloses a workpiece support for a vacuum chamber.

SUMMARY OF THE INVENTION

In accordance with a method of the present invention, a method of introducing gas into a substrate processing chamber is provided. The method comprises the steps of filling a gas metering area with the gas to a first predetermined pressure, closing the area to maintain the area at the first predetermined pressure and opening the area to the substrate processing chamber whereby the gas will expand into the chamber to provide the chamber with a second predetermined pressure.

In accordance with a first embodiment of the present invention, a substrate processing device is provided. The substrate processing device comprises a substrate processing chamber and a gas meter. The gas meter is external to the substrate processing chamber. The gas meter measures a fixed amount of gas at a first predetermined pressure to be introduced in the substrate processing chamber so that the gas when received in the substrate processing chamber has a second predetermined pressure. The gas meter measures the fixed amount of gas before the fixed amount of gas is introduced into the substrate processing chamber.

In an accordance with a second embodiment of the present invention, a substrate processing device is provided. The substrate processing device comprises a substrate processing chamber and means for introducing a predetermined amount of gas into the substrate processing chamber to achieve a final predetermined pressure in the chamber. The means for introducing the predetermined amount of gas into the substrate processing chamber comprise a fixed volume gas metering chamber to receive the gas at an initial predetermined pressure different than the final predetermined pressure.

In accordance with a third embodiment of the present invention, a substrate processing device is provided. The substrate processing device comprises a frame, a cooling chuck and a poppet. The cooling chuck is removably mounted to the frame. The poppet is removably mounted to the frame atop the cooling chuck. The poppet coacts with the cooling chuck to form a cooling chamber for cooling a substrate located in the cooling chamber. The cooling chuck has a pressure controller to control pressure in the cooling chamber. The pressure controller comprises a gas metering area between a gas supply for the cooling chamber and the cooling chuck. The gas metering area is isolable from the cooling chamber to fix in the gas metering area an amount of gas at a first predetermined pressure before the amount of gas is released into the cooling chamber.

BRIEF DESCRIPTION OF THE DRAWINGS

The foregoing aspects and other features of the present invention are explained in the following description, taken in connection with the accompanying drawings, wherein:

FIG. 7 is a control timing diagram;

DETAILED DESCRIPTION OF THE PREFERRED EMBODIMENT

Figure 1:
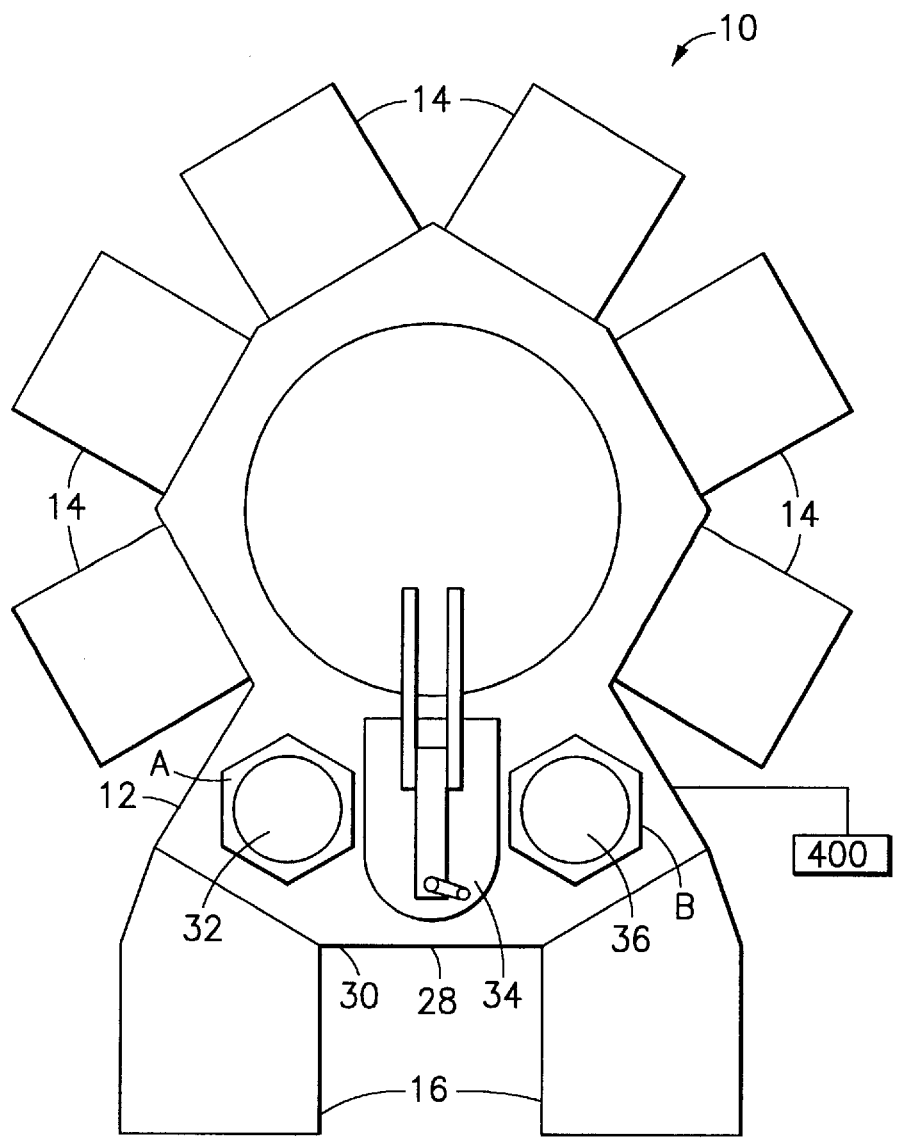
FIG. 1 is a top plan view of a substrate processing apparatus incorporating features of the present invention.

Referring to FIG. 1, there is shown a schematic top plan view of a substrate processing apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

Figure 2:
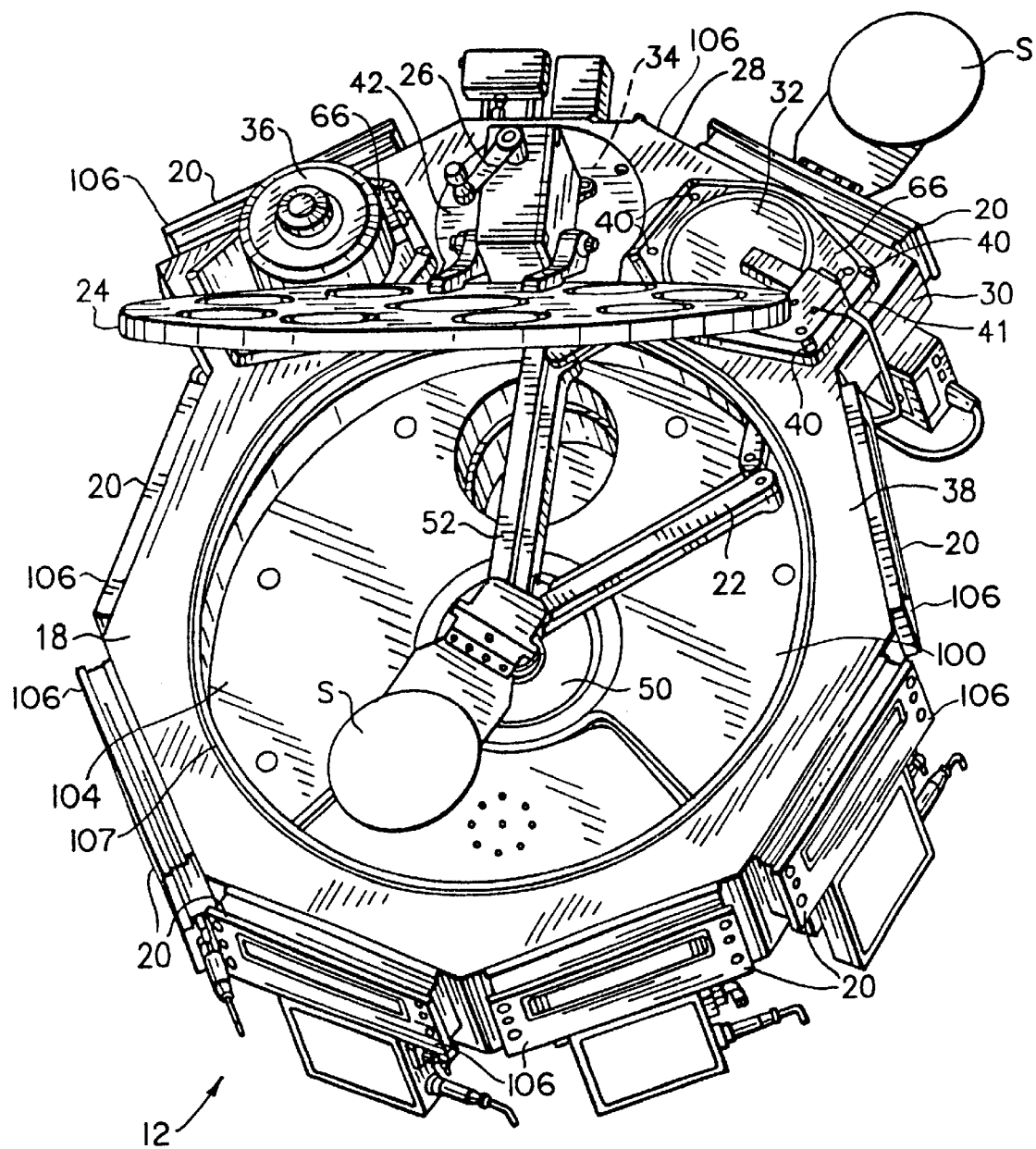
FIG. 2 is a perspective view of the main section of the apparatus shown in FIG. 1.

The apparatus 10 includes a main section 12, substrate processing modules 14, substrate holding modules or load lock modules 16 and a computer controller 400. Referring also to FIG. 2, a perspective view of the main section 12 is shown. The main section 12 has a frame 18 with multiple side apertures having door sections 20. The modules 14, 16 are connected to the door sections 20. The substrate processing modules 14 and the substrate holding modules 16 are well known in the art and, therefore, are not described further. The frame 18 of the main section 12 forms a plenum 100 bounded by an upper plate 38, a lower plate 104 and sides 106. The plenum 100 of the main section 12 is maintained in a vacuum as is known in the art to prevent contamination of the substrates when being transported between the processing modules 14 and the substrate holding modules 16. The substrates S could be semi-conductor wafers, flat panel display substrates, or any other type of substrate. The main section 12 has a substrate transport mechanism 22 for moving the substrates S among the modules 14, 16. A similar substrate transport mechanism is described in PCT patent publication No. WO 94/23911 which is hereby incorporated by reference in its entirety. However, any suitable type of substrate transport mechanism can be used.

The upper plate 38 has an access hole 107 therein and a movable top cover 24 to cover the hole 107. The cover 24 is raised and lowered with a cover movement crank 26. The front end 28 of the main section 12 has an extended section 30. In the preferred embodiment, the substrate holding modules 16 are located at the front end 28 of the main section 12. In alternate embodiments, the substrate holding modules may be placed at any other suitable location on the main section of the apparatus.

In the preferred embodiment, the extended section 30 holds an aligner 32, a buffer 34 and a cooler 36. The aligner 32 and cooler 36 are modular units installed into the plenum 100 of the main section 16 through access holes 66 in the upper plate 38. In alternate embodiments, the aligner, buffer and cooler or any suitable combination thereof may be installed on the main section 12 wholly outside the plenum 100. The buffer 34 is located directly between the aligner 32 and the cooler 36. The buffer can hold one or more substrates while waiting for the mechanism 22 to move the substrate(s) into one of the modules 14, 16. However, the buffer 34 need not be provided. The aligner 32 is used to align the substrates as is known in the art. In this embodiment the aligner 32 is a modular drop-in unit that is inserted into the frame 18 through one of the holes 66 in the upper plate 38 of the frame 18. Four screws 40 are then used to fix a mounting flange 41 of the aligner 32 to the frame 18. The crank 26 is mounted to the frame 18 by a plate 42. The plate 42 is located over the buffer 34. The plate 42 can be removed from the frame 18 to allow a user to gain access to the buffer.

Figure 3A:
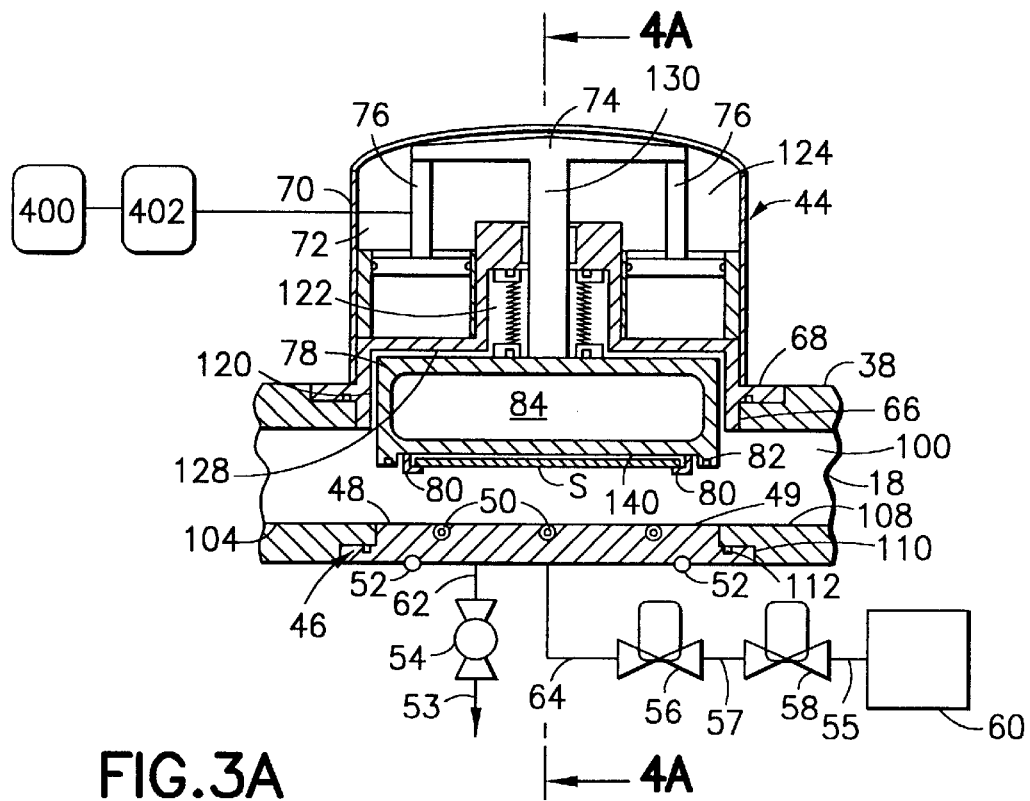
FIG. 3A is a schematic cross-sectional view of the cooler in an up position.
Figure 3B:
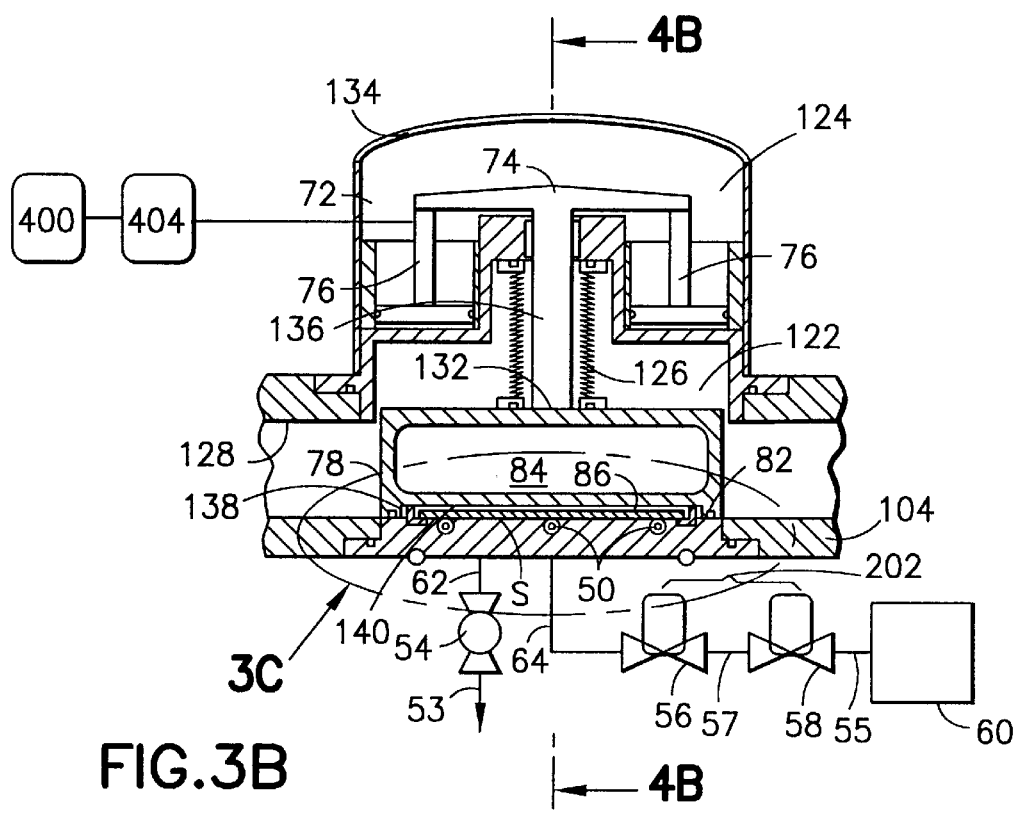
FIG. 3B is a schematic cross-sectional view of the cooler in a down position.

Referring also to FIGS. 3A and 3B, the cooler 36 comprises a top unit 44 and a bottom unit or cooling chuck 46. The bottom unit 46 comprises a heat transfer plate 48 with standoffs 50 and coolant passages 52. The heat transfer plate 48 is installed in the lower plate 104 of the frame 18. The top surface 49 of the heat transfer plate 48 is substantially flush with the upper surface 108 of the lower plate 104. The bottom unit 46 is removably mounted to the frame 18. The heat transfer plate 48 forms a rabbet joint 110 with the lower plate 104. The heat transfer plate 48 has a seal 112 located in the rabbet joint 110 between the heat transfer plate 48 and the lower plate 104. The seal 112 maintains the vacuum integrity of the plenum 100. The heat transfer plate 48 has a roughout line 53 connected to a source of vacuum (not shown). The roughout line 53 has a roughout valve 54 to isolate the plate 48 from the source of vacuum. The roughout valve 54 is connected to the heat transfer plate 48 by conduit 62. Conduit 62 extends to the top surface 49 of the heat transfer plate 48. The heat transfer plate 48 is also connected by a gas supply line 55 to a source of inert gas 60. The gas supply line 55 has a backfill valve 56 and a charging valve 58. The backfill valve 56 is connected to the charging valve 58 by a conduit 57 that forms a gas metering area as described further below. The backfill valve 56 is connected to the heat transfer plate 48 by conduit 64 which extends to the top surface 49 of the plate 48.

The top unit or poppet mechanism 44 is a modular drop-in unit that is inserted into the frame 18 through one of the holes 66 in the upper plate 38. Four screws 40 are then used to fix the mounting flange 68 to the frame 18 (see FIG. 2). The mounting flange 68 is the same size and shape as the aligner's mounting flange 41. The frame 18, aligner 32 and cooler 36 have been constructed such that the frame 18 can accept either the aligner 32 or the cooler 36 at the two locations A and B (see FIG. 1). Thus, the main section 12 could have two aligners or two coolers, or the aligner and cooler could be located at opposite sides. This modular construction allows the manufacturer to relatively easily configure the apparatus 10 to specific requirements. If no cooler and/or aligner is needed in the main section 12, sealing plates (not shown) need only be connected to the frame 18 in place of the cooler and/or aligner. Another important advantage is that, because of their drop-in assembly, the top of the aligner 32 and the top unit 44 of the cooler 36 can be easily removed from the top side of the main section 12 by merely removing their four mounting screws 40. This allows quick and easy access in the aligner and cooler, if a wafer becomes broken, in order to clean out the broken wafer. The top unit 44 includes a cover 70, a frame 72, and a moving support 74. The top unit 44 further comprises a pressure boundary 120 segregating the top unit 44 into a vacuum side 122 and a pressure side 124. The pressure boundary 120 in the top unit 44 of the cooler 36 is part of the pressure boundary formed by the frame 18 of the main section 12, and thus maintains the vacuum in the plenum 100. Portions of the top unit 44 on the vacuum side 122 of the pressure boundary 120 are exposed to the vacuum of the plenum 100. Portions of the top unit 44 on the pressure side 124 of the pressure boundary 120 are exposed to ambient atmospheric conditions. The pressure boundary 120 in the top unit 44 is formed by frame 72 and a bellows seal 126 between the frame 72 and the moving support 74. The frame 72 is stationarily connected to the upper plate 38 of the frame 18. The lower surface 128 of the frame 12 is part of the pressure boundary 120 in the top unit 44.

The moving support 74 has drive sections or mechanical actuators 76 and a lower support 78. The drive sections 76 are movably mounted to the frame 72 on the pressure side 124 of the pressure boundary 120. The drive sections 76 are connected to the lower support 78 to drive the lower support 78 up and down in a poppet motion, relative to the frame 72 (see FIGS. 3A and 3B). In the preferred embodiment, the drive sections 76 are hydraulically or pneumatically powered piston or jack heads. The drive sections 76 move up and down relative to the frame 72 and thereby move the lower support 78 up and down. In alternate embodiments, any suitable drive-actuator combination may be used to move the lower support 78 as a poppet. For example, the drive sections may be electro-mechanically powered jack screws.

Figure 4A:
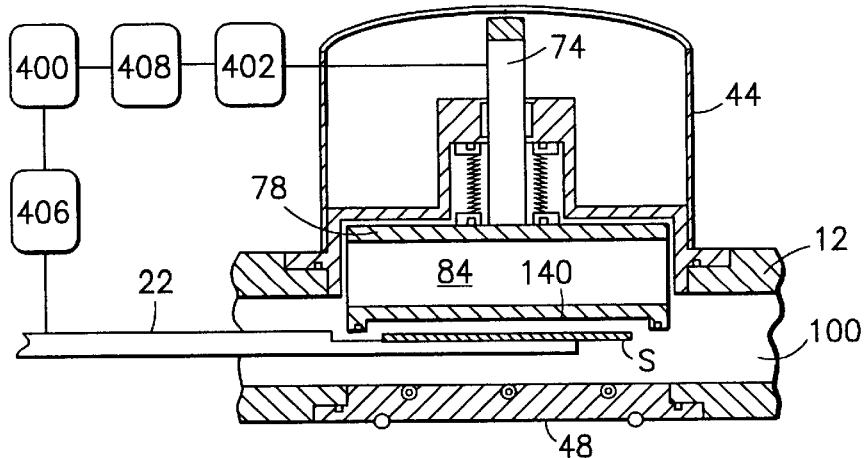
FIG. 4A is a schematic cross-sectional view of the cooler taken along line 4A—4A of FIG. 3A showing a substrate being loaded onto the movable substrate support.
Figure 4B:
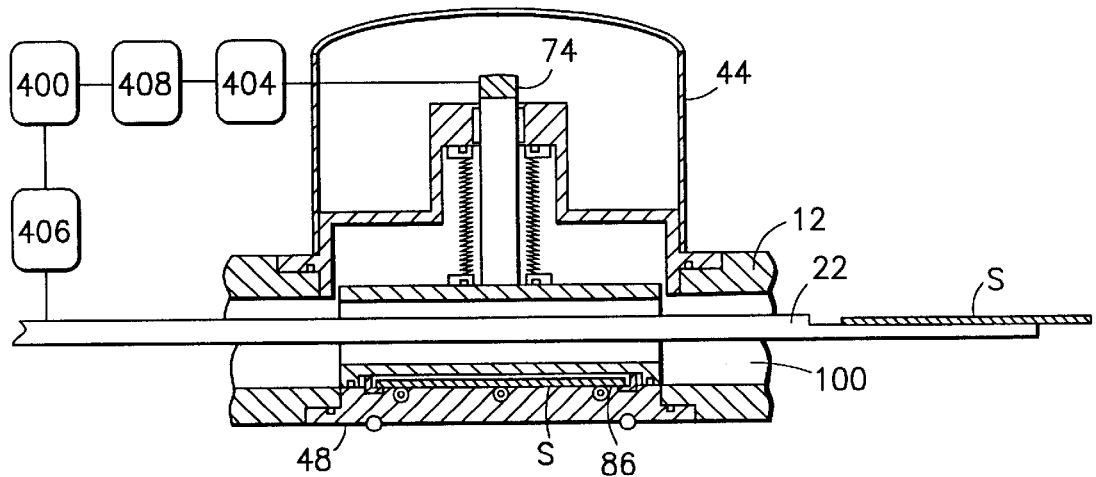
FIG. 4B is a schematic cross-sectional view of the cooler taken along line 4B—4B of FIG. 3B showing a robot arm passing through the pass-through hole.

The moving support 74 has a connector section 130 connecting the drive sections 76 to the lower support 78. The lower support 78 is suspended from the lower end 132 of the connector section 130. The drive sections 76 are connected to the upper end 134 of the connector section 130. The upper end 134 is located on the pressure side 124 of the top unit 44. A connector rod 136 extends between the upper end 134 and the lower end 132 of the connector section 130. The lower support 78 is located on the vacuum side 122 of the top unit 44. The connector rod 136 extends through the lower surface 128 of the frame 72. The bellows seal 126 between the frame 72 and the lower support 78 surrounds the connecting rod 136 to preserve the pressure boundary 120. The stroke of the drive sections 76 is adapted to raise the lower support 78 into an up position for loading or unloading a substrate and to lower the support 78 into a down position for cooling a substrate. FIGS. 3A and 4A show the moving support 74 in the up position. FIGS. 3B and 4B show the moving support 74 in the down position. The lower support 78 has a lower surface 138 with a substrate receiving recess 140 formed therein. A seal 82 surrounds the recess 140. Substrate support arms 80 extend below the lower surface 138. The lower support also has a through hole 84 to admit therethrough the transport mechanism 22. In the up position, shown in FIG. 3A, a substrate S can be loaded onto or removed from the arms 80 by the transport mechanism 22

Figure 3C:
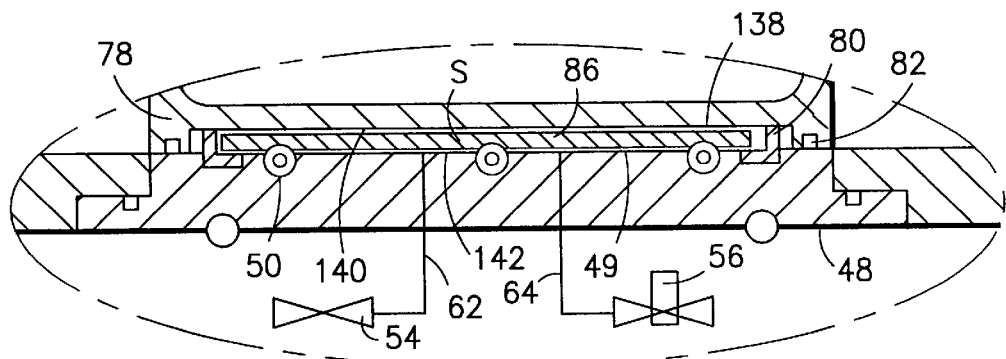
FIG. 3C is a magnified view of area 3C of the substrate cooling chamber shown in FIG. 3B.

(see also FIG. 4A). After a substrate S is loaded onto the support arms 80, the lower support 78 is moved down so that the seal 82 engages the top surface 49 of the heat transfer plate 48, as shown in FIG. 3B. In the down position, shown also in FIG. 4B, the transport mechanism 22 can pass through the hole 84 to extend into the holding module 16. When the seal 82 engages the top surface 49, an enclosed chamber 86 is formed in way of the substrate receiving recess 140 between the lower surface 138 of the lower support 78 and the upper surface 49 of the heat transfer plate 48. The enclosed chamber 86 is sealed by seal 82. Referring also to FIG. 3C, the substrate S is placed on the standoffs 50 of the heat transfer plate 48. The standoffs 50 project above the upper surface 49 of the heat transfer plate 48 so that the substrate S placed on the standoffs is positioned within the substrate receiving recess 140 when the seal 82 engages the heat transfer plate 48. The upper surface of the heat transfer plate has grooves formed therein to admit the support arms 80 when the lower support 78 is in the down position so that the seal 82 engages the upper surface. The standoffs 50 provide a gap 142 between the substrate S and the upper surface 49 of the heat transfer plate 48 as shown in FIG. 3C. When the chamber 86 is closed, the inert gas is introduced into the chamber 86 for gas assisted cooling of the substrate S. The source of inert gas 60 provides the gas which is introduced via the supply line 55, through the heat transfer plate 86, into the chamber 86 (see FIG. 3B).

Substrates processed in the substrate processing modules 14 can have elevated temperatures resulting from the processes to which the substrates are subjected to. For example, in the case where the substrates are semiconductor wafers, the temperature of the wafers is raised typically to approximately 250° C. in order to degas the wafers. Substrates having elevated temperatures must be cooled prior to removal from the processing apparatus 10. This prevents contamination of the substrates, which occurs more readily at elevated temperatures, and also eliminates the need for special handling equipment to handle the hot substrates. The substrates are cooled by heat transfer to a heat sink, provided by the heat transfer plate 48 in the preferred embodiment. Under vacuum, heat transfer between the substrate S and the heat transfer plate 48 is primarily effected by radiation. However, cooling rates provided by radiation are very low when the temperature difference between the hot and cold surfaces is approximately 300° C. Heat transfer by conduction is also very limited under vacuum because contact between even substantially flush surfaces is very localized due to micro-irregularities of each surface. Heat transfer rates between the hot substrates and a heat sink can be substantially increased by providing an inert gas therebetween, whereby the primary means for heat transfer is gas convection/conduction. The gas must be contained in a chamber to prevent despoiling the vacuum in the main section 18. In the preferred embodiment, chamber 86 is the substrate cooling chamber. The allowable pressure of the gas inside the chamber 86 is limited by the design of the seal 82 between the chamber 86 and the vacuum plenum 100. The higher the pressure differential across the seal 82 the more complex the seal 82 must be to prevent gas leaking from the chamber 86 past the seal 82. Nevertheless, the pressure of the gas inside the chamber must be sufficient to provide effective heat transfer. A gas pressure of about 20 torr (0.38 psig) has been found sufficient to provide efficient heat transfer between the substrate S and the heat transfer plate 48. To handle this low pressure in the chamber 86, the seal 82 is a simple single gasket seal 83 as is known in the art, and therefore not described further.

In the past, regulating the gas pressure inside a cooling chamber has been a problem. Conventional pressure gages are ineffective at a pressure of about 20 torr. Hence, convection pressure gages were used in the art to measure gas pressure when pressurizing a cooling chamber. Convection pressure gages are very costly and very fragile requiring repeated replacement. The invention disclosed herein overcomes this problem by eliminating the convection pressure gage. In the present invention, the gas pressure inside the substrate cooling chamber 86 is controlled by introducing a known fixed amount of inert gas, at a known fixed pressure, into the known volume of the evacuated chamber 86, so that the resulting pressure of the gas in the chamber 86 is about 20 torr. This known fixed amount of inert gas is metered prior to being introduced into the chamber 86. The gas is metered by admitting the gas at a controlled pressure into a metering chamber of known volume and closing the chamber to form therein a gas charge having a known volume at a known pressure. The metering of the gas charge prior to its introduction into the chamber 86 eliminates the need for the convection pressure gage to measure the pressure in the chamber 86.

Figure 5:
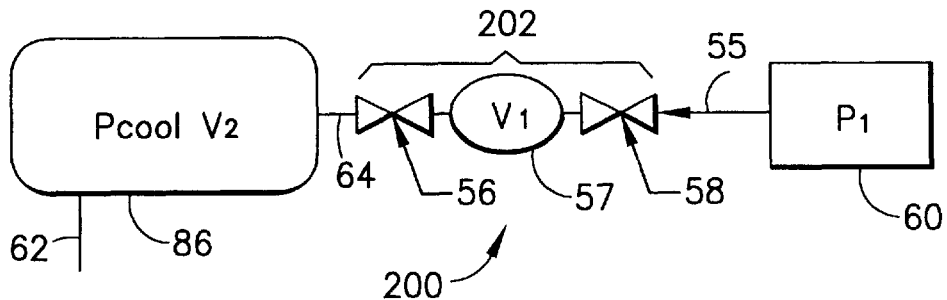
FIG. 5 is a schematic diagram of the gas supply system shown in FIG. 3A.

FIG. 5 shows in schematic form the gas meter 200 for controlling the pressure in the substrate cooling chamber 86. The gas meter 200 comprises a gas metering chamber 202 which is located on the gas supply line 55 connecting the source of inert gas 60 to the substrate cooling chamber 86. The gas metering chamber 202 has a fixed predetermined volume $V_1$. The volume $V_1$ of the gas metering chamber 202 is substantially the volume of conduit 57. The small volumes within the bodies of valves 56, 58 contribute little to the overall volume $V_1$ of the gas metering chamber 202. The gas metering chamber 202 can be isolated on its downstream side from the substrate cooling chamber 86 by the backfill valve 56. On its upstream side, the gas metering chamber 202 is isolated from the gas source 60 by the charging valve 58. The gas source 60 delivers inert gas into the gas metering chamber 202 to pressurize the gas charge therein to a predetermined pressure $P_1$. The gas metering chamber 202 is then isolated from the gas source 60 and the gas charge is allowed to expand into the evacuated substrate cooling chamber 86 having a predetermined volume $V_2$. The resulting backfill pressure $P_{cool}$ in the substrate cooling chamber 86 is dependent on the ratio between the volume $V_2$ of the substrate cooling chamber 86 and volume $V_1$ of the gas metering chamber 202 as well as the initial pressure $P_1$ in the gas metering chamber 202. This relationship is explained by Boyle's gas law.

Boyle's Gas Law states that:

$$P_i V_i = P_f V_f \quad (1)$$

where:
 $P_i$=initial gas pressure of a fixed amount of gas in an initial volume
 $V_i$=an initial volume of the gas
 $P_f$=final gas pressure of the gas in a final volume
 $V_f$=a final volume of the gas
With reference to FIG. 5 the relationship described by Boyle's gas law as provided by equation (1) becomes:

$$P_1 V_1 + P_2 V_2 = P_{cool}(V_1 + V_2) \quad (2)$$

where:
 $P_1$=initial pressure of the gas charge in the gas metering chamber 202
 $V_1$=volume of the gas metering chamber 202

$P_2$=initial pressure in the substrate cooling chamber 86 when it is evacuated $V_2$=volume of the substrate cooling chamber 86

$P_{cool}$=final backfill pressure of the gas charge when it expands from the gas metering chamber 202

$(V_1+V_2)$=final volume into which the gas charge from the gas metering chamber 202 expands Assuming that $P_2 \approx 0$ when the substrate cooling chamber 86 is evacuated equation (2) becomes:

$$P_1 V_1 = P_{cool}(V_1+V_2) \tag{3}$$

and assuming that $V_1 \ll V_2$, equation (3) becomes:

$$P_1 \left( \frac{V_1}{V_2} \right) = P_{cool} \text{ or} \tag{4(a)}$$

$$P_1 = (V_2/V_1) P_{cool} \tag{4(b)}$$

Equation (4)(b) describes the relationship between $P_{cool}$ the final pressure in the substrate cooling chamber 86, relative to the initial gas pressure $P_1$ in the gas metering chamber 202 and the volume ratio $V_2/V_1$ of the gas metering chamber 202 to substrate cooling chamber 86. The volume ratio $V_2/V_1$ of the gas metering chamber 202 to substrate cooling chamber 86 is predetermined so that the pressure $P_1$ to which the gas source pressurizes the gas charge in the metering chamber 202 results in a backfill pressure $P_{cool}$ in the substrate cooling chamber 86 of about 20 torr, when the gas charge expands. For example, if the volume ratio $V_2/V_1$ is set at 100 (i.e.: the volume $V_1$ of the gas metering chamber is 1/100 of the volume $V_2$ of the substrate cooling chamber) then in order to achieve a backfill pressure $P_{cool}$ of the 20 torr the pressure of the gas charge must be 2000 torr. The pressure of the gas charge $P_1$ is calculated as follows:

$P_{cool} \cong 20$ Torr (0.38 psia)

Assume $V_2/V_1 = 100$ $P_1 = 2,000$ Torr (38 psia); or 23 psig

Figure 6:
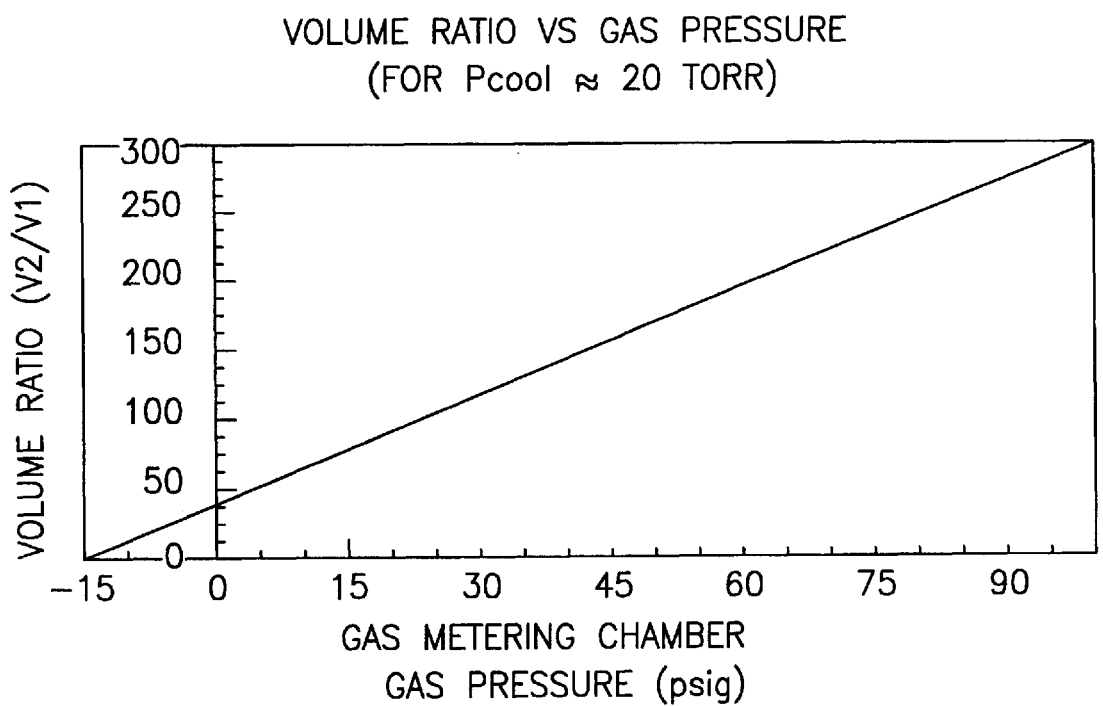
FIG. 6 is a graph of the relationship of volume ratio to gas metering chamber pressure for a backfill gas pressure of 20 Torr.

FIG. 6 is a graph showing the relationship of the volume ratio $V_2/V_1$ to gas charge pressure $P_1$ for a backfill pressure $P_{cool}$ of 20 torr. The gas charge pressure $P_1$ is plotted on the abscissa and the volume ratio $V_2/V_1$ is plotted on the ordinate axis. The graph in FIG. 6 shows that as the gas charge pressure $P_1$ is increased, the volume ratio $V_2/V_1$ of the substrate cooling chamber to gas metering chamber must be increased proportionally.

Figure 8:
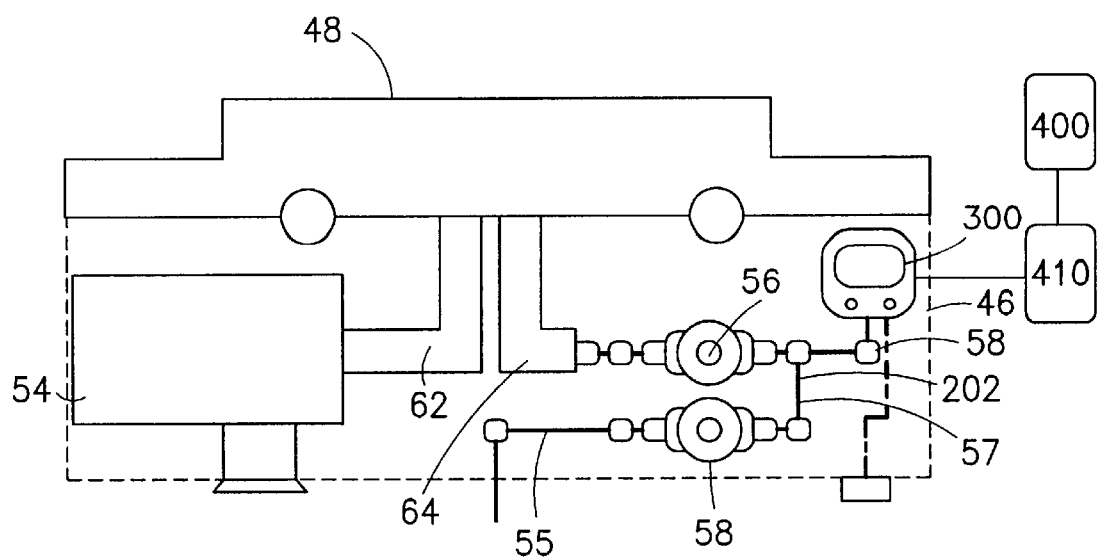
FIG. 8 is a schematic diagram of the bottom unit of the cooler.

The ratio of the substrate cooling chamber 86 volume $V_2$ to the gas metering chamber 202 volume $V_1$ is established by the mechanical design of the chambers 86, 202 and the conduit 64 connecting the chambers 86, 202 to each other and the conduit 62. In the preferred embodiment, the gas metering chamber 202 comprises the backfill valve 56, the charging valve 58 and the conduit 57 therebetween (see FIG. 5). Hence, the volume $V_1$ of the gas metering chamber 202 is defined by the volume of the conduit 57. This volume $V_1$ is fixed by the internal dimensions of the conduit 57. In alternate embodiments, the gas metering chamber may comprise any suitable components which provide a known fixed volume. As seen best in FIG. 3C, the volume $V_2$ includes the volume of the chamber 86, the volume of the conduit 64 connecting the substrate cooling chamber 86 to the backfill valve 56 and the volume of the conduit 62 connecting the substrate cooling chamber to the roughout valve 54. The volume $V_2$ of the substrate cooling chamber 86 is constrained by the design requirements for the substrate cooling chamber 86 and the conduits 62 and 64. The volume of the recess 140 in the lower support 78 is defined by the depth and area dimensions of the recess 140. The area of the recess 140 is sized to admit the substrate S therein. The depth of the recess 140 is sized so that, when the substrate cooling chamber 86 is formed, the substrate S is accommodated in the recess 140 and a sufficient gap 142 is provided between the substrate S and the heat transfer plate 48. The gap 142 allows the inert gas charge to flow under the substrate S. The volume of the conduits 62 and 64 are established by the diameter and length of conduits 62 and 64 required to extend the conduits 62 and 64 through the heat transfer plate 48 to the location of the roughout valve 54 or backfill valve 56. The aforementioned design requirements are substantially fixed. Hence, the volume $V_2$ of the substrate cooling chamber 86 is also substantially fixed, and thus, obtaining the appropriate volume ratio, $V_2/V_1$ between the substrate cooling chamber 86 and gas metering chamber 202 is most readily achieved by providing the conduit 57 with the proper volume $V_1$. The appropriate volume ratio $V_2/V_1$, is selected in accordance with the graph in FIG. 6 to suit the available measure $P_1$ from the gas source 60. Once the appropriate volume ratio $V_2/V_1$ is identified, and given the volume $V_2$ of the substrate cooling chamber 86, the length and internal diameter of the conduit 57 are set to provide the required volume $V_1$. A gas supply pressure of about 23 psig is a readily attainable gas pressure that can be established with off the shelf gas regulators. From FIG. 6, a volume ratio $V_2/V_1$ of 100 is appropriate for a gas supply pressure of 23 psig in order to achieve a pressure $P_{cool}$ in the substrate cooling chamber 86 of at least 20 torr (0.38 psia). A volume ratio $V_2/V_1$ of 100 is manageable given the constraints of the mechanical design of the bottom unit 46 of the cooler 36. As shown in FIG. 8, in the preferred embodiment, the bottom unit 46 contains all the necessary plumbing to backfill the substrate cooling chamber 86 with approximately 20 torr of gas pressure. The necessary plumbing includes the gas supply line 55 with the gas metering chamber 202. The gas supply line 55 is positioned and supported from the heat transfer plate 48 so that the gas supply line is integral with the bottom unit 46. The gas supply line 55 is mechanically connected to the source 60 of inert gas. The roughout line 53 is mechanically connected to the source of vacuum. When the gas supply line 55 and roughout line 53 are disconnected from the gas supply 60 and and vacuum source respectively, the heat transfer plate 48 may be removed from frame 18 with the gas supply line 55 and roughout line 53 as a module. In alternate embodiments, the gas metering chamber and all other necessary plumbing may be affixed to the frame 18 of the main section 12.

The gas used to assist cooling the substrate in the substrate cooling chamber 86 is preferably an inert gas. Argon is the preferred backfill gas for high vacuum systems while nitrogen is more suitable for rough vacuum systems. Argon has a lower thermal conductivity than nitrogen, making it less effective in heat conduction, but overall shows a better performance due to its higher pumping speed in high vacuum applications. Furthermore, Argon is a noble gas and is invisible to chemical reactions whereas nitrogen may interfere with some process chemistries.

The apparatus 10 includes a computer controller 400, see FIG. 1, to control the movements of the substrate transport mechanism 22, the moving support 74 and the valves 54, 56, 58 of the cooler 36. The computer controller 400 synchronizes the movements of the moving support 74 with the release of the gas charge from the gas metering chamber 202. The moving support 74 is lowered into its down position, as shown in FIGS. 3B and 4B, prior to gas release. The moving support 74 remains down during the cooling cycle. The moving support 74 is raised only when the substrate cooling chamber 86 is roughed out by a source of vacuum. The computer controller 400 also synchronizes the movement of the moving support 74 with the position of the robot transport arm 22. When the moving support 74 is in the up position, as shown in FIGS. 3A and 4A, the controller 400 can partially extend the transport arm 22 under the lower support 78 to pick up or place a substrate on the support arms 80 of the lower support 78. The controller 400 maintains the moving support 74 in the up position during loading or unloading of the substrate. When the moving support 74 is lowered in the down position, the transport arm 22 may be fully extended to move substrates through hole 84 in the lower support 78 to or from the holding module 16 adjoining the cooler 36 (see FIG. 4B). The controller maintains the moving support 74 in the down position when the transport arm extends through the hole 84 in the lower support 78.

In the preferred embodiment, the controller 400 controls the movement of the moving support 74 in a manner similar to a typical VAT slot gate valve with sensors. A "Poppet Up" limit switch 402 signals when the moving support 74 is in the up position shown in FIG. 3A. A "Poppet Down" limit switch 404 signals when the moving support 74 is in the down position shown in FIG. 3B. To raise the moving support 74, the controller asserts moving support 74 raise and leaves it asserted until the "Poppet Up" limit switch 402 signal transitions from 0 to 1 (i.e., the poppet up limits switch closes). To lower the moving support 74, the controller asserts moving support 74 lower until the "Poppet Down" limit switch 404 is tripped. Both the raising and lowering operations are subject to a time-out for error checking purposes. In alternate embodiments, the controller 400 may control the movement of the moving support by any suitable means. To synchronize the movements of the moving support 74 and substrate transport arm 22, the computer controller has the following interlocks. A "Poppet Raise/Lower Permissive" interlock 406 allows movement of the moving support 74 only when the transport arm 22 is retracted. This prevents damage to the transport arm 22 and moving support 74. The "Poppet Raise/Lower Permissive" interlock 406 is enabled by an appropriate sensor which signals when the transport arm 22 is retracted. A "Robot Load/Unload and Passthrough Permissive" interlock 408 allows the robot transport arm 22 to extend partially, to load/unload substrates from the lower support 78, or extend fully, to pick or place substrates in the holding module 16, only when the moving support 74 is in the up position or in the down position. This allows the transport arm 22 to extend without interference from the moving support 74. The "Robot Load/Unload and Passthrough Permissive" interlock 408 is enabled when either the "Poppet Up" limit switch or "Poppet Down" limit switch is closed (see FIGS. 4A and 4B). The computer controller 400 also has a "Poppet Open Permissive" interlock 410 to provide permission to raise the moving support 74, and hence open the substrate cooling chamber 86 upon completion of the cooling cycle (see FIG. 8). This interlock is enabled when the substrate cooling chamber 86 is roughed out at the end of the cooling cycle. Thus, the moving support 74 cannot be moved until the cooling chamber 86 is restored to a vacuum which prevents contamination of the plenum 100 of the main section 12. In the preferred embodiment, the charging valve 58 and backfill valve 56 do not have position indication. Instead, a pressure switch 300 with programmable high set point and low set point outputs senses the pressure in the gas metering chamber 202 (see FIG. 8). The pressure switch 300 also senses the pressure in the substrate cooling chamber 86 when the backfill valve 56 is open. The "Poppet Open Permissive" interlock 410 is enabled by the pressure switch 300 "Pressure Low" signal which indicates the cooling chamber 86 is evacuated. In alternate embodiments the vacuum condition of the substrate cooling chamber 86 may be sensed and signaled to the computer controller by any suitable means.

The backfill valve 56, the charging valve 58 and the roughout valve 54 are remotely actuated and are controlled by the computer controller 400. In the preferred embodiment, the roughout valve 54 is a KP-6 single stage angle poppet valve. The valve is single acting with a pneumatic actuator. The backfill valve 56 and charging valve 58 are ¼ inch outer diameter high purity diaphragm valves with single acting pneumatic actuators. In alternate embodiments, the backfill, charging and roughout valves may be any suitable remotely operated valves. In the preferred embodiment the pressure switch 300 is a digital pressure switch with programmable high and low set points. Typically, the high set point is set at 10 psig, and the low set point is set at −14.3 psig. In alternate embodiments, the pressure switch may be any suitable programmable type with high and low set points. The pneumatically actuated drive sections 76 of the moving support 74 and the pneumatically actuated backfill 56 charging 58 and roughout 54 valves have electrical and pneumatic interfaces of system control, such as pilot solenoid valves, controlled by the computer controller 400.

Figure 9:
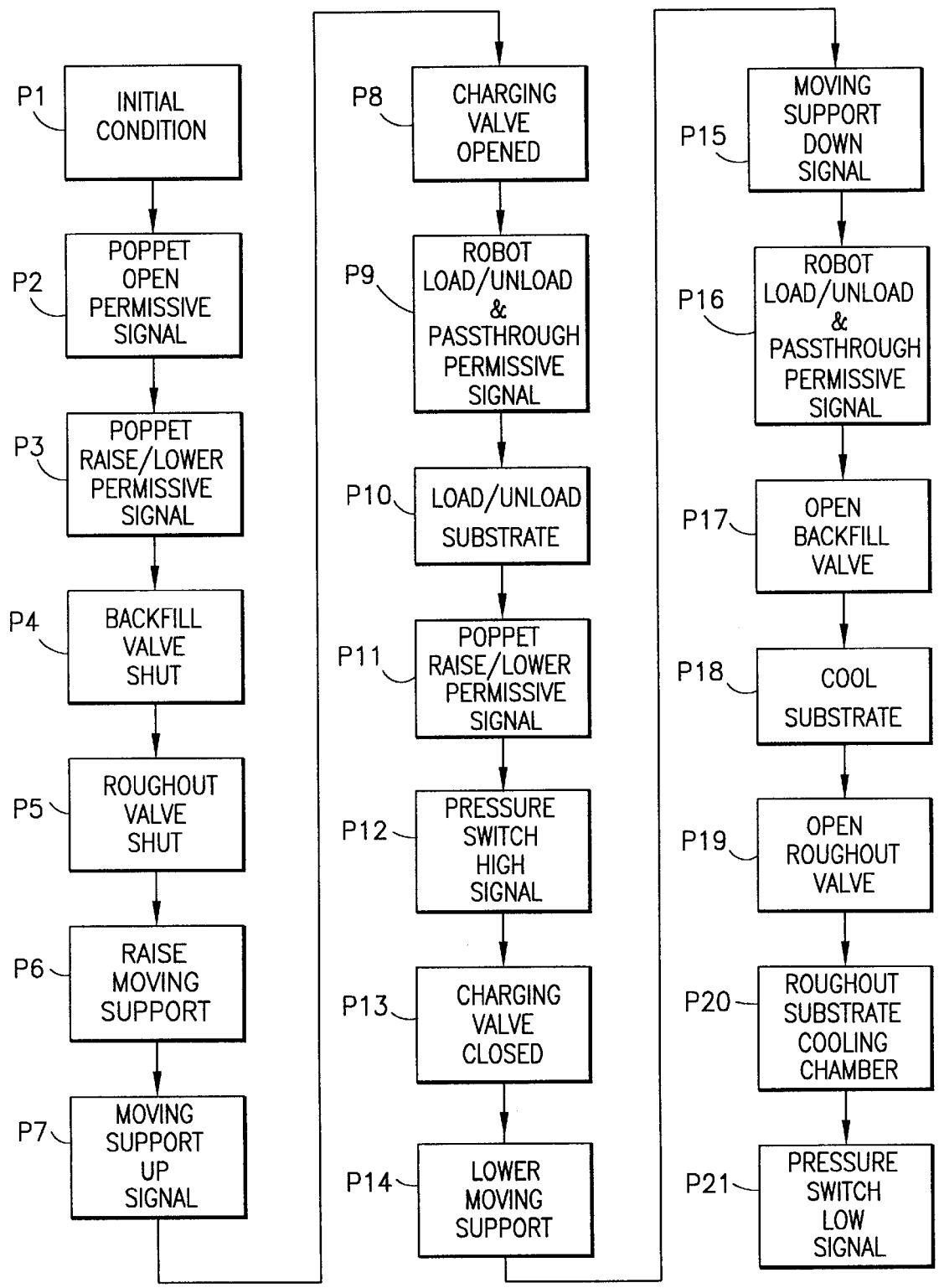
FIG. 9 is a flow chart depicting the sequence for cooling a substrate in the cooler.

The cooling cycle for cooling a substrate S in the substrate cooling chamber 86 follows a very simple sequence. The cycle involves discharging a fixed quantity of gas into the closed substrate cooling chamber 86 and relying on heat transfer between this gas and the heat transfer plate 48. After a period of time, the gas is roughed out allowing the substrate cooling chamber 86 to be opened. FIG. 9 is a flowchart depicting the steps for cooling a substrate in the substrate processing apparatus 10. The sequence of steps generally proceeds as follows. In its initial state, the cooler 36 has the following configuration. The charging valve 58 is closed. The backfill valve 56 and the roughout valve 54 are open. The moving support 74 is in the down or closed position shown in FIG. 3B. The cooling cycle commences by first loading a substrate S into the substrate cooling chamber 86. To accomplish this step, the roughout valve 54 and backfill valve 56 are closed. The moving support 74 is moved to its up or opened position shown in FIG. 3A. The transport mechanism is partially extended to place the substrate S on the arms 80 of the lower support 78 (see FIG. 4A). The transport mechanism is retracted. The moving support 74 is then moved to the closed position (see FIG. 3B). Concurrent with the substrate loading operation, the gas charge is metered in the gas metering chamber 202. Actually, the metering can occur concurrent with any step in which the backfill valve 56 is closed (i.e., any step except the discharge portion of the cooling cycle below).

The gas is metered by opening the charging valve 58 to admit the inert gas from gas source 60 into the conduit 57. The charging valve 58 remains open for a specified period of time insuring that the volume in conduit 57 between the charging valve 58 and the backfill valve 56 is pressurized to the same level as the pressure of the gas source 60 (roughly 40 psig). This time interval is fixed (i.e., not user settable) as it is a property of the physical configuration of the conduit 57 and the type of gas source 60. The charging valve 58 is then closed. The pressure switch 300 at the conduit 57 will actuate the programmed high output indicating a gas charge is present in the conduit 57 and that the charging valve 58 has cycled. After the substrate S is loaded into the substrate cooling chamber 86 and the gas charge is metered, the substrate S can then be cooled. The backfill valve 56 is opened, discharging the fixed volume of gas into the cooling chamber 86. The cooling chamber 86 now remains closed for a user programmable period of time (the cool time). This time will be a function of the gas pressure, the chill plate temperature, and the temperature of the substrate S when received in the chamber 86. The pressure switch 300 will return to its neutral state (no high or low set points tripped). Roughout of the substrate cooling chamber 86 is performed after the cool time expires. The roughing line 53 is opened, by opening the roughout valve 54, for a fixed period of time to remove the gas in the cooling chamber 86. The pressure switch 300 will actuate the programmed low output indicating a low pressure is present and that the roughout valve 54 has cycled. Finally, after roughout is complete, the substrate S is unloaded from the substrate cooling chamber 86. The sequence for unloading the substrate from the cooling chamber 86 is similar to the sequence for loading. The roughout valve 54 and the backfill valve 56 are closed. The moving support 74 is moved to an opened or up position and the substrate is removed by the robot 22. Normally, a substrate exchange occurs (i.e., a new substrate is placed on the arms 80 while the moving support 74 is still opened) and a new cool cycle occurs. If, however, the moving support 74 is closed with no substrate, the roughing line 53 should be reopened to restore the cooler 36 to the initial state.

The substrate processing apparatus 10 preferably has the following features to improve substrate handling and prevent substrate damage when in the apparatus 10. The computer controlling monitors an "excessive temperature" sensor which will trip if the temperature of the heat transfer plate 48 goes above the level required for effective cooling. Also, valve operations will be subject to time-outs for error checking purposes. The substrate sensor on the cooling module, which was present in the prior art, has been removed. Since the ability to determine the proper placement of a substrate is nearly impossible and furthermore prohibitive, a substrate sensor does not improve reliability or prevent substrate breakage. The high reliability of the substrate transport robot 22 and substrate tracking ability of the system control software will ensure proper substrate handling. In order for the robot 22 to reliably handle substrates, the moving support mechanism 74 must be repeatable and the substrate must not move during the cool cycle. Sufficient testing should be conducted to verify that the substrate position does not drift during operation.

The control system of the cooler 36 preferably has Failure Modes to protect against:

1. Loss of electrical power, and
2. Loss of control air pressure.

All pilot solenoid valves should remain as is upon loss of electrical signal. In the event of loss of facilities airs pressure, the system control air distribution system should have sufficient accumulation to prevent air pressure from dropping below 50 psig over 30 minutes. A check valve should be installed between the facilities bulkhead connection and the point of distribution. Additionally, a gage with low pressure set point should be installed to indicate air supply pressure upstream of the check valve.

FIG. 7 is a timing diagram of the controller 400 operation during the cooling cycle. The control detail is preferably as follows:

| Controllable Functions (Digital Outputs) | Indications (Digital Inputs): |
|---|---|
| Poppet Raise Pilot Solenoid | Poppet up |
| Poppet Lower Pilot Solenoid | Poppet down |
| Charging Valve Pilot Solenoid | Gas Pressure (High) |
| Backfill Valve Pilot Solenoid | Gas Pressure (Low) |
| Roughout Valve Pilot Solenoid | Cool chuck high temperature T > 30° C. (warning) |

The operation of the controller 400 during the cooling cycle of the substrate is diagrammatically depicted in the flow chart of FIG. 9. The preferred operation is as follows:
Initial Conditions:
P1 a. The moving support 74 is closed or is lowered to its closed position with air pressure applied to drive sections 76.
  b. The "Poppet Down" limit switch is tripped to indicate that the moving support 74 is in the closed position.
  c. The charging valve 58 is shut.
  d. The backfill valve 56 is open.
  e. The roughout valve 54 is open.
  f. Regulated (~40 psig) Nitrogen/Argon gas is supplied to charging valve 58.
  g. The roughtout valve 54 is connected to a suitable vacuum source (<100 m Torr).
  h. A substrate may or may not be present in substrate cooling chamber 86.
Load/Unload
P2. "Poppet Open Permissive" interlock is enabled
P3. "Poppet Raise/Lower Permissive" interlock is enabled.
P4. Shut backfill valve 56.
P5. Shut roughout valve 54.
P6. Raise the moving support 74.
P7. The moving support "Poppet Up" limit switch is tripped.
P8. Open charging valve 58.
P9. "Robot Load/Unload & Pass Through Permissive" interlock is enabled.
P10. Robot 22 removes cooled wafer (if one exists and places hot wafer on arms 80 of lower support 78.
P11. "Poppet Raise/Lower Permissive" interlock is enabled.
P12. Pressure switch 300 high pressure signal.
P13. Shut charging valve 58.
Cool
P14. Lower moving support 74.
P15. Moving support 74 "Poppet Down" limit switch tripped.
P16. "Robot Load/Unload and Passthrough Permissive", enabled (transport arm 22 commences transport of substrates from holding module 16.)
P17. Open backfill valve 56.
P18. Cool substrate. Wait cool period, (operator programmable).
P19. Open roughout valve 54.
P20. Wait roughout period, (operator programmable).
P21. Pressure switch 300 low pressure signal. Signal wafer scheduler "Cooling process complete, ready for unload".

The substrate processing apparatus 10 of the present invention has been greatly simplified over the prior art. Several functions have been greatly simplified to maximize performance and minimize complexity of the mechanics. The differences include: drop-in interface to system transport chambers, simplified gas assisted cooling, and removal of onboard control electronics.

The moving support 74 of the cooler 36 was repackaged to facilitate service from the top. The moving mechanisms of the cooler 36 are assembled as a drop-in top unit cartridge 44. All serviceable parts (i.e., the seal 82, support arms 80, bellows seal 126) can be readily replaced after removing the drop-in top unit 44. The heat transfer plate 48 is readily cleaned when this top-unit 44 is removed. During the life of the system and under normal operation, the heat transfer plate 48 should not require removal from the transport chamber.

The fundamental method of gas assisted wafer cooling was maintained with several modifications. The key modification is that the gas backfill under the moving support 74 is metered using a fixed volume of pressurized gas which is then allowed to expand into the previously evacuated cooling chamber 86. This simplification eliminates poppet pressure monitoring and errors attributed to convection gage drift. In alternate embodiments, the water cooling loop 52 may also be removed due to the relatively low heat load placed on the cooler 36 and the relatively large conductive cooling capacity of the plenum 100 lower surface 104. The embedded controller used in the prior art is eliminated and all functional control resides in the main section controller 400. Presently five bits of digital input/output are required. Features of the present invention could be used in a heater rather than a cooler, or in a combined heater/cooler. Furthermore, features of the present invention could also be used in one of the substrate processing chambers for gas assisted processing.

It should be understood that the foregoing description is only illustrative of the invention. Various alternative and modifications can be devices by those skilled in the art without departing from the scope of the invention. Accordingly, the present invention is intended to embrace all such alternative, modifications and variances which fall within the scope of the appended claims.

What is claimed is:

1. A method of introducing gas into a substrate processing chamber comprising steps of:

filling a gas metering area with the gas to a first predetermined pressure;

closing the area to maintain the area at the first predetermined pressure; and opening the area to the substrate processing chamber whereby the gas will expand into the chamber to provide the chamber with a second predetermined pressure.

2. A method as in claim 1 wherein the step of filing comprises closing a backfill valve between the gas metering area and the substrate processing chamber and then opening a charging valve between the gas metering area and a gas supply.

3. A method as in claim 1 wherein the step of closing the area comprises shutting a charging valve to isolate the gas metering area from a gas supply, and wherein the charging valve is shut after a predetermined time after opening the charging valve so that the gas metering area is maintained at the first predetermined pressure.

4. A substrate processing device comprising:

a substrate processing chamber; and a gas meter external to the substrate processing chamber for measuring a fixed amount of gas at a first predetermined pressure to be introduced in the substrate processing chamber so that the gas when received in the substrate processing chamber has a second predetermined pressure;

wherein the gas meter measures the fixed amount of gas before the fixed amount of gas is introduced into the substrate processing chamber.

5. A substrate processing device as in claim 4 wherein the gas meter is located on a gas supply line supplying gas to the substrate processing chamber.

6. A substrate processing device as in claim 4 wherein the gas meter comprises a gas metering chamber in a gas supply line supplying gas to the substrate processing chamber.

7. A substrate processing device as in claim 6 wherein the gas metering chamber has a fixed volume.

8. A substrate processing device as in claim 6 wherein the gas metering chamber has a backfill valve to isolate the gas metering chamber from the substrate processing chamber.

9. A substrate processing device as in claim 8 wherein the gas metering chamber has a charging valve to isolate the gas metering chamber from a gas supply for the substrate processing chamber.

10. A substrate processing device as in claim 9 wherein the backfill valve and the charging valve are ¼ inch outer diameter high purity diaphragm valves.

11. A substrate processing device as in claim 9 wherein the gas metering chamber comprises a conduit having a predetermined length and a predetermined diameter connecting the charging valve to the backfill valve.

12. A substrate processing device as in claim 11 wherein the fixed amount of gas is measured in the gas metering chamber by admitting gas from the gas supply into the conduit when the backfill valve is closed and the charging valve is open and then closing the charging valve after a predetermined time.

13. A substrate processing device as in claim 4, wherein the substrate processing chamber has a heat transfer plate forming a lower surface of the substrate processing chamber.

14. A substrate processing device as in claim 13, wherein the substrate processing chamber has a poppet portion and wherein the poppet portion co-acts with the heat transfer plate to form the substrate processing chamber when the poppet portion is in a lowered position.

15. A substrate processing device as in claim 14, wherein the heat transfer plate has a gas outlet therethrough for admitting the fixed amount of gas measured by the gas meter, the outlet communicating through a conduit with the gas meter.

16. A substrate processing device comprising:

a substrate processing chamber; and means for introducing a predetermined amount of gas into the substrate processing chamber to achieve a final predetermined pressure in the chamber;

wherein the means for introducing the predetermined amount of gas into the substrate processing chamber comprise a fixed volume gas metering chamber to receive the gas at an initial predetermined pressure different than the final predetermined pressure.

17. A substrate processing device as in claim 16, wherein the gas metering chamber comprises a backfill valve to isolate the gas metering chamber from the substrate processing chamber, a charging valve to isolate the gas metering chamber from a gas supply and a conduit connecting the backfill valve to the charging valve.

18. A substrate processing device as in claim 17, wherein the conduit has a predetermined diameter and a predetermined length to define a predetermined volume so that gas received in the volume of the conduit at the initial predetermined pressure forms the predetermined amount of gas required to achieve the final predetermined pressure in the substrate processing chamber when the predetermined amount of gas is released from the gas measuring chamber and introduced into the substrate processing chamber.

19. A substrate processing device comprising:

a frame;

a cooling chuck removably mounted to the frame; and a poppet removably mounted to the frame atop the cooling chuck, the poppet co-acting with the cooling chuck to form a cooling chamber for cooling a substrate located in the cooling chamber;

wherein, the cooling chuck has a pressure controller to control pressure in the cooling chamber, the pressure controller comprising a gas metering area between a gas supply for the cooling chamber and the cooling chamber, wherein the gas metering area is isolable from the cooling chamber to fix in the gas metering area an amount of gas at a first predetermined pressure before the amount of gas is released into the cooling chamber.

20. A substrate processing device as in claim 19, wherein the gas metering area has a fixed volume bounded on a downstream side by a backfill valve to isolate the gas metering area from the cooling chamber, and bounded on an upstream side by a charging valve to isolate the gas metering area from the gas supply.

* * * * *